(12) United States Patent
Gole et al.

(10) Patent No.: US 7,186,669 B2
(45) Date of Patent: Mar. 6, 2007

(54) SILICON BASED NANOSPHERES AND NANOWIRES

(75) Inventors: James L. Gole, Atlanta, GA (US); Zhong L. Wang, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 286 days.

(21) Appl. No.: 10/261,148

(22) Filed: Sep. 30, 2002

(65) Prior Publication Data

US 2006/0014018 A1    Jan. 19, 2006

Related U.S. Application Data

(63) Continuation-in-part of application No. 09/820,413, filed on Mar. 29, 2001, now Pat. No. 6,720,240.

(60) Provisional application No. 60/325,677, filed on Sep. 28, 2001.

(51) Int. Cl.
*B01J 21/00* (2006.01)
*H01L 23/58* (2006.01)

(52) U.S. Cl. .................. 502/242; 502/232; 502/349; 257/253; 257/414

(58) Field of Classification Search ........... 428/402.24, 428/402, 403; 526/908, 915; 502/439, 232, 502/240, 242, 300, 349; 257/253, 414
See application file for complete search history.

(56) References Cited

U.S. PATENT DOCUMENTS 3,640,901 A * 2/1972 Walker .................. 502/214

4,706,493 A * 11/1987 Chang et al. ............ 73/31.06

OTHER PUBLICATIONS

Gole, Stout, Rauch, Wang; Direct synthesis of silicon nanowires, silica nanospheres, and wire-like nanosphere agglomerates; Applied Physics Letters, vol. 76, No. 17, Apr. 24, 2000, pp. 2346-2348.
Hu, Odom, Lieber; Chemistry and Physics in One Dimension: Synthesis and Properties of Nanowires and Nanotubes, Acc. Chem. Res. 1999, vol. 32, No. 5, 1999, pp. 435-445.
Gole, White; Nanocatalysis: Selective Conversion of Ethanol to Acetaldehyde Using Monoatomically Dispersed Copper on Silica Nanospheres; Journal of Catalysis, pp. 2-15.
Crooks, Zhao, Sun, Chechik, Yeung; Dendrimer-Encapsulated Metal Nanoparticles: Synthesis, Characterization, and Applications to Catalysis; Accounts of Chemical Research, vol. 34, No. 3, Mar. 2001; pp. 181-189.
Kenvin and White; Supported Catalysts Prepared from Mononuclear Copper Complexes: Catalytic Properties; Journal of Catalysis; 1992; pp. 81-91.
J. L. Gole and Z. L. Wang; $SnO_x$ Nanocrystallites Supported by Silica Nanostructures; Nano Letters, 2001, vol. 1, No. 8; pp 449-451.

* cited by examiner

*Primary Examiner*—Thao T. Tran
(74) *Attorney, Agent, or Firm*—Thomas, Kayden, Horstemeyer & Risley, LLP

(57) ABSTRACT

Nanostructures and methods of fabrication thereof are disclosed. One representative nanostructure includes a silicon dioxide ($SiO_2$)/tin oxide ($SnO_x$) nanostructure, where x is between about 1 to about 2. The $SiO_2/SnO_x$ nanostructure includes a $SiO_2$ nanostructure having $SnO_x$ nanoclusters dispersed over a portion of the surface of the $SiO_2$ nanostructure.

46 Claims, 3 Drawing Sheets

SILICON BASED NANOSPHERES AND NANOWIRES

CROSS-REFERENCE TO RELATED APPLICATION

This application is a continuation-in-part of U.S. Utility Application entitled, "SILICON BASED NANOSPHERES AND NANOWIRES," having Ser. No. 09/820,413, filed Mar. 29, 2001, now U.S. Pat. No. 6,720,240, which is entirely incorporated herein by reference.

This application claims priority to copending U.S. Provisional Application entitled, "TIN OXIDE NANOWIRES, NANORIBBONS, AND NANOTUBES", filed with the United States Patent and Trademark Office on Sep. 28, 2001, and assigned Ser. No. 60/325,677, which is entirely incorporated herein by reference.

TECHNICAL FIELD

The present invention is generally related to nanostructures and, more particularly, is related to nanowires, nanospheres, and nanotubes and methods for their preparation and use.

BACKGROUND OF THE INVENTION

Semiconductor nanostructures, nanoagglomerates, and nanowires have attracted considerable attention because of their potential applications in mesoscopic research, the development of nanodevices, and the potential application of large surface area structures. For several decades, the vapor-liquid-solid (VLS) process, where gold particles act as a mediating solvent on a silicon substrate forming a molten alloy, has been applied to the generation of silicon whiskers. The diameter of the whisker is established by the diameter of the liquid alloy droplet at its tip. The VLS reaction generally leads to the growth of silicon whiskers epitaxially in the <111> direction on single crystal silicon <111> substrates. In addition, laser ablation techniques have been performed on metal-containing (iron or gold) silicon targets, producing bulk quantities of silicon nanowires. Further, thermal techniques have been used to produce a jumble of silicon dioxide ($SiO_2$) coated crystalline nanowires that have their axes parallel to the <112> direction. Further, these nanowires are deficient because of twinning, high order grain boundaries, and stacking faults.

Recently, national lab researchers, in an effort to begin an ongoing dialogue to forecast the direction of environmental science and technology, ranked the top ten environmental technology breakthroughs for 2008. Not surprisingly, molecular design is expected to play an important role in the development of advanced materials. Included in this framework is the design of nano-assembled and non-stoichiometric catalysts designed for the efficient control of chemical processes.

Heterogeneous catalysts are typically prepared by decorating high surface area solids such as silica or alumina with active metals or metal ions from precursor materials such as cation complexes $[M^{n+} L^{m-}_x]^{(n-xm)}$, anion complexes (e.g., $[Pt^{4+} F_6]^{2-}$), or neutrals such as copper (II) acetylacetonate ($Cu(AcAc)_2$). These processes typically use starting reagents and produce products that are harmful to the environment (e.g. solvents, metal halides, strong acids, or other environmentally aggressive reagents and or products). A high-surface-area support is needed to provide the proper dispersion of the active ingredients so that the high intrinsic activity of these catalytic metals or ions can be realized in practice. Without this support, many catalytic agents show very little active surface area. Often, the intrinsic catalytic activity of the supported metals or metal ions is changed by interaction with the support metal ions or oxygen atoms. Thus, some supports are not benign towards the catalytic agents. Moreover, the catalytic properties of these agents are often compromised as a result of the efforts to synthesize supported catalysts having high dispersions of the active ingredient. These uniquely assembled catalysts might then be used to more efficiently control combustion processes and reactions such as hydrocarbon reforming.

Thus, a heretofore unaddressed need exists in the industry to address the aforementioned deficiencies and inadequacies.

SUMMARY OF THE INVENTION

Embodiments of the present invention provide for nanostructures and methods of fabrication thereof. One representative of an embodiment of a nanostructure of the present invention includes a silicon dioxide ($SiO_2$)/tin oxide ($SnO_x$) nanostructure, where x is between about 1 to about 2. The $SiO_2/SnO_x$ nanostructure includes a $SiO_2$ nanostructure having $SnO_x$ nanoclusters dispersed over a portion of the surface of the $SiO_2$ nanostructure.

Another embodiment of the present invention provides for methods of forming nanostructures. An exemplary method includes forming a silicon dioxide ($SiO_2$)/tin oxide ($SnO_x$) nanostructure, where x is between about 1 to about 2. The $SiO_2/SnO_x$ nanostructure includes a $SiO_2$ nanostructure having $SnO_x$ nanoclusters dispersed over a portion of the surface of the $SiO_2$ nanostructure.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1A is a transmission electron microscopy (TEM) image showing silicon dioxide ($SiO_2$) having tin oxide ($SnO_x$) nanoclusters disposed thereon, while FIG. 11B is a high resolution TEM (HRTEM) showing the crystalline structure of a $SiO_2/SnO_x$ nanostructure shown in the TEM image shown in FIG. 1A.

DETAILED DESCRIPTION

Figure 1A:
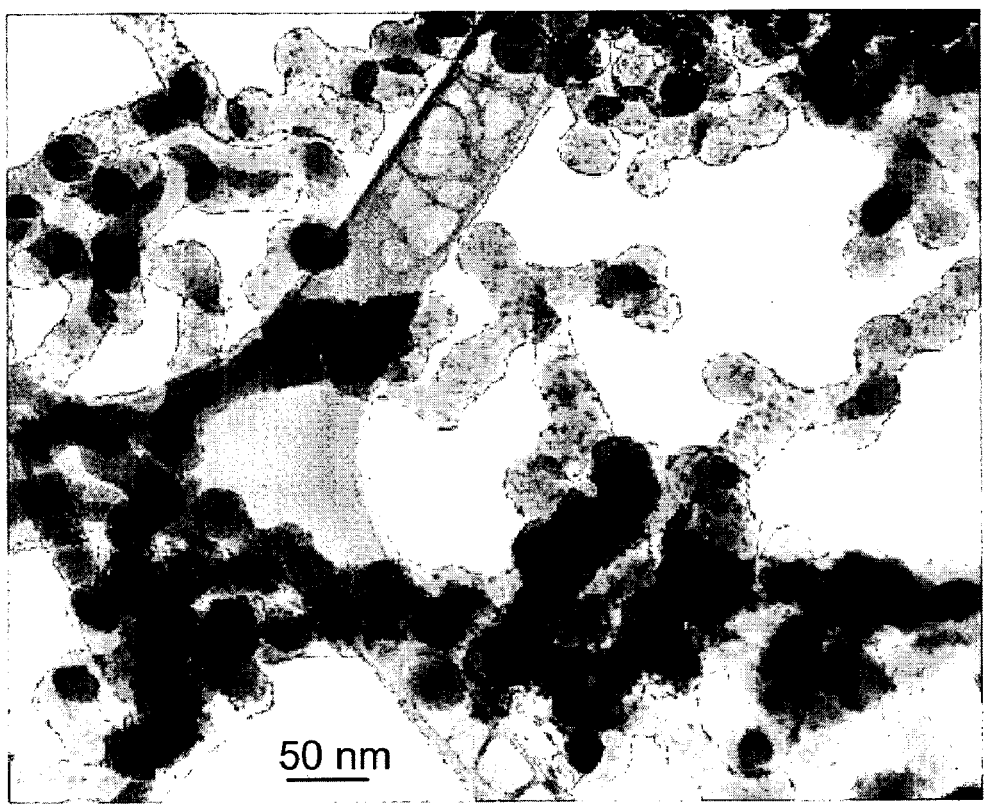

Embodiments of the present invention provide for nanostructures, catalytic nanostructures, and methods of preparation thereof. Nanostructures include, but are not limited to, nanowires, nanospheres, nanoagglomerates, nanotubes, etc. More specifically, exemplary embodiments of the present invention provide a nanowire and methods of preparation thereof. Another exemplary embodiment provides a nanosphere and methods of preparation thereof. Still another exemplary embodiment provides a catalytic nanosphere and methods of preparation thereof (e.g., a metallized nanosphere with catalytic activity). The nanostructures can be made of materials such as, but not limited to, metals, metal oxides, metalloids, metalloid oxides, combinations of metals, combinations of metal oxides, combinations of metalloids, combinations of metalloid oxides, combinations of metals and metal oxides, combinations of metalloid and metalloid oxides, or any other appropriate combination. Further, the nanostructures can be metallized to form catalytic nanostructures that can be used to enhance reaction kinetics and reaction efficiency. Furthermore, another embodiment of the present invention includes nanostructures (e.g., silica nanospheres) having metal oxides (e.g., tin oxide ($SnO_x$)) disposed on the surface of the nanostructure and methods of preparation thereof.

A. Nanowires and Nanospheres

One exemplary embodiment of the present invention provides for a nanowire prepared under thermal and non-catalytic conditions. The thermal conditions include, but are not limited to, the range of 800° C. to 1500° C. The term non-catalytic conditions means, for the purposes of this disclosure, that an additional catalyst is unnecessary for the nanostructures to be fabricated. In an exemplary embodiment, the nanowire can be fabricated to form metal, metal oxide, metalloid, metalloid oxide, or combinations thereof nanowires. In a preferred embodiment, the nanowires include silicon dioxide sheathed crystalline silicon nanowires where the axis of the crystalline silicon nanowire core is substantially parallel to a <111> plane. In addition, the silicon nanowires are substantially defect free. That is, the silicon nanowires are substantially free of twinning, high order grain boundaries, and stacking faults. Non-limiting examples of metals from which the nanowires can be fabricated include, but are not limited to, tin (Sn), chromium (Cr), iron (Fe), nickel (Ni), silver (Ag), titanium (Ti), cobalt (Co), zinc (Zn), platinum (Pt), palladium (Pd), osmium (Os), gold (Au), lead (Pb), iridium (Ir), molybdenum (Mo), vanadium (V), aluminum (Al), or combinations thereof. In addition, non-limiting examples of metal oxides which the nanowires can be fabricated into include, but not limited to, tin dioxide ($SnO_2$), chromia ($Cr_2O_3$), iron oxide ($Fe_2O_3$, $Fe_3O_4$, or FeO), nickel oxide (NiO), silver oxide (AgO), titanium oxide ($TiO_2$), cobalt oxide ($Co_2O_3$, $Co_3O_4$, or CoO), zinc oxide (ZnO), platinum oxide (PtO), palladium oxide (PdO), vanadium oxide ($VO_2$), molybdenum oxide ($MoO_2$), lead oxide (PbO), and combinations thereof. In addition, a non-limiting example of a metalloid includes, but is not limited to, silicon or germanium. Further, a non-limiting example of a metalloid oxide includes, but is not limited to, silicon monoxide, silicon dioxide, germanium monoxide, and germanium dioxide.

Another exemplary embodiment of the present invention provides for a plurality of nanospheres that are substantially monodisperse and a method of preparation thereof. In addition, the nanospheres can be fabricated in gram quantities under thermal and non-catalytic conditions. The thermal condition includes, but is not limited to, the range of 800° C. to 1500° C. The term non-catalytic conditions means that an additional catalyst is unnecessary for the nanostructures to be fabricated. Further, the nanospheres can be fabricated to form metal, metal oxide, metalloid, metalloid oxide, or combinations thereof nanospheres. Non-limiting examples of metals from which the nanospheres can be fabricated include, but are not limited to, tin (Sn), chromium (Cr), iron (Fe), nickel (Ni), silver (Ag), titanium (Ti), cobalt (Co), zinc (Zn), platinum (Pt), palladium (Pd), osmium (Os), gold (Au), lead (Pb), iridium (Ir), molybdenum (Mo), vanadium (V), aluminum (Al), and combinations thereof. In addition, non-limiting examples of metal oxides from which the nanospheres can be fabricated include, but not limited to, tin dioxide ($SnO_2$), chromia ($Cr_2O_3$), iron oxide ($Fe_2O_3$, $Fe_3O_4$, or FeO), nickel oxide (NiO), silver oxide (AgO), titanium oxide ($TiO_2$), cobalt oxide ($Co_2O_3$, $Co_3O_4$, or CoO), zinc oxide (ZnO), platinum oxide (PtO), palladium oxide (PdO), vanadium oxide ($VO_2$), molybdenum oxide ($MoO_2$), lead oxide (PbO), and combinations thereof. In addition, a non-limiting example of a metalloid includes, but is not limited to, silicon and germanium. Further, a non-limiting example of a metalloid oxide includes, but is not limited to, silicon monoxide, silicon dioxide, germanium monoxide, and germanium dioxide. The nanospheres can range in diameter from a few nanometers to on the order of hundreds of nanometers. More particularly, silicon dioxide nanospheres are amorphous, have no dangling bonds, and range in diameter from about 8–45 nanometers (nm). Further, the method of fabricating nanospheres and nanowires using thermal techniques can be similar. In this regard, both nanospheres and nanowires can be fabricated using similar fabrication steps. Modifications in fabrication parameters, disclosed hereinafter, can be used to control the quality and quantity of the fabricated nanospheres and nanowires.

EXAMPLE 1

The following is a non-limiting illustrative example of an embodiment of the present invention that is described in more detail in Gole, et al., Appl. Phys. Lett., 76, 2346 (2000), which is incorporated herein by reference. This example is not intended to limit the scope of any embodiment of the present invention, but rather is intended to provide specific experimental conditions and results. Therefore, one skilled in the art would understand that many experimental conditions can be modified, but it is intended that these modification are within the scope of the embodiments of the present invention.

The apparatus to fabricate silicon based nanostructures includes a double concentric alumina tube combination that can be heated to the desired temperature in a Lindberg Scientific tube furnace configuration. The inner alumina tube is vacuum sealed by two water cooled stainless steel end pieces which are attached to the alumina tube and tightly lock-press fit against custom viton o-rings. At one end of the furnace, ultra-high purity argon (Ar) enters through the upstream stainless steel end piece and passes through a matched set of zirconia insulators to the central region of the inner tube oven. Here the entraining argon flows over a crucible containing the sample mixture of interest, which may be either a silicon-silica (Si/$SiO_2$) mixture or powdered silicon monoxide, at a flow rate of 100 standard cubic centimeter per minute (sccm) controlled by a flow controller. It should be noted that other sample mixtures can be used that correspond to the metals listed hereinabove.

The total tube pressure in the inner tube can range from 200 to 650 Torr as measured by a Baratron differential pressure transducer, but is typically about 225 Torr. The pressure in the inner tube can be controlled by a mechanical pump or other appropriate pump attached to the inner alumina tube through the downstream stainless steel end piece. This end piece is mechanically attached to a "water cooled" cold plate, with an adjustable temperature system, through a matching set of insulating zirconia blocks. Depending on the desired temperature range of operation, the crucibles used to contain the silicon/silicon oxide based mixtures were either commercially available quartz (1200–1350° C.) or alumina (1400–1500° C.) or were machined from low porosity carbon (1500° C.). The parameters that can be controlled in this experiment were (1) gas flow rate, (2) total tube gas pressure, (3) central region temperature and temperature gradients to the end regions, and (4) cold plate temperature. The ultra-high purity argon was not heated before it enters the inner furnace tube, although it could be heated. The condensation of silicon-based nanowires produced dark brown deposits in a narrow region on the wall of the inner alumina tube, close to the defining end points of the Lindberg oven shell, which corresponds to a temperature in the range approximately 900–1000° C. Large quantities (e.g. gram quantities) of $SiO_2$ nanospheres were deposited on the temperature controlled cold plate.

In an exemplary embodiment, virtually uniform and straight nanowires were generated from a 50/50 Si/$SiO_2$ equimolar mixture heated to a temperature of about 1400° C. at a total pressure of about 225 Torr for about 12 hours. The central crystalline silicon core for the nanowire is about 30 nm in diameter, whereas the outer $SiO_2$ sheathing is about 15 nm in thickness, as exemplified in Gole et al., Appl. Phys. Lett., 76, 2346 (2000), which is incorporated herein by reference. However, nanowires with much smaller and larger diameter central crystalline cores and different sheathing thickness have been obtained. The axis of the $SiO_2$ clad crystalline silicon nanowire core is substantially parallel to the <111> plane. This is distinct from the results obtained by Lee et al., MRS Bulletin, 36 (1999) whose wires have their axis parallel to <112> plane as they display twinning, high order grain boundaries, and stacking faults. At the Si—$SiO_2$ interface for the material obtained in the present synthesis the crystal planes are best described as {211}. The nanowires synthesized are so perfect that slight undulations of the crystalline silicon core, due to strain induced by measuring devices, can be observed.

Other distinguishing characteristics of the nanowires include the pinch off of the crystalline silicon core at the beginning of the wire growth, suggesting a distinctly different formation mechanism than that suggested by Lee et al. for their wires generated using a similar source and by Hu et al., Acc. Chem. Res. 32, 435 (1999) for their iron-catalyzed wire formation from Fe/Si mixtures generated using laser ablation. While Lee et al. find evidence for a growth mechanism along <111> with which they associate a complex process involving $SiO_2$ formation, the observed structures generated using the described thermal source likely indicate that the mechanism for these nanowires is a close analogy to the VLS mechanism, albeit with an apparent self-assembly of the silicon in the absence of a metal catalyst. Further, the outer $SiO_2$ sheath of the nanowire has significant strength. Finally, a comparison to the transmission electron micrograph (TEM) micrographs of Hu et al., which show the clear termination of their nanowires at larger—nearly spherical $FeSi_2$ nanoclusters, offers yet an additional contrast suggesting further alternate mechanisms for the wire formation. The mechanism for formation of the nanowires in the present study would appear to be distinct and possess both the attributes of the Si/$SiO_2$ reaction mechanism presented by Lee et al. and of the VLS growth method.

Nearly monodisperse $SiO_2$ nanospheres in the diameter range of 8–45 nm can be generated as a deposit in gram quantities on the cold plate of the described apparatus. Nanospheres can be generated in the same apparatus that produced the nanowires. By adjusting the flow parameters and temperature, it is possible to generate nanospheres ranging in diameter from 8–45 nm in virtually monodisperse distributions. It is possible to generate these nanospheres not only from Si/$SiO_2$ mixtures but also from SiO powders, albeit at somewhat higher temperatures.

Judicious manipulation of the high temperature system including reactant mixture stoichiometry, flow conditions (kinetics), and temperature range, may yield more than would have been previously anticipated by others skilled in the art. The results suggest that additional mechanisms which are analogs not only of the VLS mechanism on the nanoscale but also represent some crystalline silicon self-assembly may be operative. Further, Lee et al. produce a jumble of uniform $SiO_2$ coated crystalline silicone nanowires of various sizes which, when straight, have their axes parallel to <112>. These wires, however, display twining, high order grain boundaries, and defect sites (stacking faults). In contrast, embodiments of the present invention are capable of producing nanowires where the axis of the nanowire core is substantially parallel to a <111> plane, virtually defect free, and demonstrate no twining. Given the high temperature synthesis of alternate combinations of metal/metal oxide nanowire configurations, embodiments of the present invention appear to be well suited to photonic waveguide applications.

B. Nanosphere Catalysts

Still another exemplary embodiment of the present invention provides a catalytic nanosphere (e.g., metallized nanosphere) and method of preparation thereof. The nanosphere of this embodiment can be formed in a manner similar to the preparation of nanospheres described earlier and includes the same properties as those nanospheres. After the nanospheres are fabricated, the nanospheres can be metallized to form metallized nanospheres that are capable of having catalytic properties. One of many advantages of this embodiment is that the nanosphere and metallized nanosphere can be fabricated in one step rather than multiple steps, as required by present techniques in the art.

Non-limiting examples of metals from which the nanospheres can be fabricated include, but are not limited to, tin (Sn), chromium (Cr), iron (Fe), nickel (Ni), silver (Ag), titanium (Ti), cobalt (Co), zinc (Zn), platinum (Pt), palladium (Pd), osmium (Os), gold (Au), lead (Pb), iridium (Ir), molybdenum (Mo), vanadium (V), aluminum (Al), and combinations thereof. In addition, non-limiting examples of metal oxides from which the nanospheres can be fabricated include, but not limited to, tin dioxide ($SnO_2$), chromia ($Cr_2O_3$), iron oxide ($Fe_2O_3$, $Fe_3O_4$, or FeO), nickel oxide (NiO), silver oxide (AgO), titanium oxide ($TiO_2$), cobalt oxide ($CO_2O_3$, $CO_3O_4$, or CoO), zinc oxide (ZnO), platinum oxide (PtO), palladium oxide (PdO), vanadium oxide ($VO_2$), molybdenum oxide ($MoO_2$), lead oxide (PbO), and combinations thereof. In addition, a non-limiting example of a metalloid includes, but is not limited to, silicon and germanium. Further, a non-limiting example of a metalloid includes, but is not limited to, silicon monoxide, silicon dioxide, germanium monoxide, and germanium dioxide. The nanospheres can range in diameter. More particularly, silicon dioxide nanospheres are amorphous, have no dangling bonds, and range in diameter from about 8–45 nanometers.

Further, the method of metallization is capable of depositing a second metal onto the nanosphere. The term "second metal" is used here to differentiate the material (e.g. metal, metalloid, or oxides thereof) that the nanosphere may be fabricated into, and refers to the metal that is deposited upon the nanosphere during a metallization process. The second metals that can be deposited during the metallization process include, but are not limited to, copper, tin, aluminum, silver, platinum, palladium, iron, cobalt, nickel, combinations thereof, and other appropriate metallization metals.

EXAMPLE 2

The following is a non-limiting illustrative example of an embodiment of the present invention that is described in more detail in Gole, et al., submitted to J. Appl. Phys., Gole et al. submitted to Chemistry of Materials, which are herein incorporated by reference. This example is not intended to limit the scope of any embodiment of the present invention, but rather is intended to provide specific experimental conditions and results. Therefore, one skilled in the art would understand that many experimental conditions can be modified, but it is intended that these modifications are within the scope of the embodiments of the present invention.

Silica nanospheres, of about a 30 nm diameter, can be prepared at elevated temperature (e.g. 800–1500° C.) from an $Si/SiO_2$ mixture. Under ambient conditions, the high population of surface hydroxyl groups on these nanospheres, confirmed by FTIR spectroscopy, is probed by decorating the surfaces of the spheres with the metal complex copper (II) acetylacetonate: $Cu(AcAc)_2$. These metal complexes are known in the art to be anchored by the surface SiOH species, and can be converted into an active catalyst by thermolysis of the ligands. The resulting monatomic copper distribution forms a selective catalyst whose conversion efficiency appears to be at least comparable to, if not better than, Cu/fumed silica described in Kenvin, et al., J. Catal. 135, 81 (1992). In contrast to the fumed silica, however, the preparation of this catalyst support is environmentally benign.

Dispersed nanospheres have been fabricated without the use of solvents and without producing byproducts, such as hydrochloric acid gas, to compromise the environment. The synthesis technique uses a mixture of silicon and silicon dioxide, heated under a flow of ultra high purity argon at elevated temperature for a specified duration. The synthesis method can produce silica nanospheres, having nearly monodisperse particle size of about 30 nm. These nanospheres, as demonstrated by high-resolution transmission electron microscopy and x-ray diffraction, are amorphous. Further, as elaborated in more detail in this example, the silica nanosphere has surface properties that demonstrate the presence of surface silanol groups (—SiOH) which can be used to sequester active Cu sites for the selective conversion of ethanol to acetaldehyde. A surface population of —SiOH groups on silica can influence the bonding of metal complexes to the surface. The loading of the metal complexes and the resulting morphology of the supported metal ions is influenced by the —SiOH groups on the surface. Silica nanospheres are contacted with $Cu(AcAc)_2$ in acetonitrile in sufficient concentration to produce silica nanospheres that contain about 3 wt % Cu. This same procedure has been used to make monatomic dispersions of Cu ions on fumed amorphous silica manufactured and commercially available from the Cabot Corporation (Cab-O-Sil™) Alpharetta, Ga.

The products of the ethanol dehydrogenation reaction depend upon the ensemble size of supported Cu ions. Isolated copper ions catalyze only the dehydrogenation to acetaldehyde whereas multiple Cu ensembles show high yields of ethyl acetate in addition to acetaldehyde. Thus, the ethanol/acetaldehyde probe reaction can be used to define the presence of monatomic dispersions of Cu ion from an examination of the product distribution.

TEM micrographs indicate that nearly monodisperse $SiO_2$ nanospheres of diameter of close 30 nm can be generated in gram quantities on the cold plate of the high temperature synthesis device described earlier. As described earlier, the apparatus includes a double concentric alumina tube combination heated to the desired temperature in a Lindberg Scientific tube furnace configuration. The inner alumina tube is vacuum sealed by two water cooled stainless steel end pieces which are attached to the alumina tube and tightly lock-press fit against custom viton™ o-rings. At one end of the furnace, ultra high purity argon enters through the upstream stainless steel end piece and passes through a matched set of zirconia insulators to the central region of the inner tube oven. The entraining argon then flows over a crucible containing the sample mixture of interest, which is either a silicon-silica ($Si/SiO_2$) mixture or powdered silicon monoxide, at a flow rate of 100 sccm controlled by a flow controller.

The total tube pressure in the inner tube can range from 200 to 650 Torr but is typically about 225 Torr. This pressure can be controlled by a mechanical pump or other appropriate pump attached to the inner alumina tube through the downstream stainless steel end piece. This end piece is mechanically attached to a water cooled cold plate, which has as adjustable temperature system, through a matching set of insulating zirconia blocks. Depending on the desired temperature range of operation, the crucibles used to contain the silicon/silicon oxide based mixtures are either commercially available quartz (1200–1350° C.) or alumina (1400–1500° C.) or are machined from low porosity carbon (1500° C.). The controlled parameters may include for example, but not limited to, (1) gas flow rate, (2) total tube gas pressure, (3) central region temperature and temperature gradients to the end regions, and (4) cold plate temperature. It is to be noted that, at least for the experimental results reported here, no attempt was made to heat the ultra high purity argon before it enters the inner furnace tube. Large quantities of $SiO_2$ nanospheres were deposited on the temperature controlled cold plate.

The Cu/silica catalysts were prepared through batch impregnation of 1 g of the silica with sufficient $Cu(AcAc)_2$ metal complex to produce a sample having 3 wt % Cu. The complex was added to 25 mL of acetonitrile solvent and allowed to reflux with stirring for 24 h. The solid was separated by filtration and dried at room temperature for 18 h. This solid was dried at 100° C. for 1 hour then placed in a microreactor tube.

The ethanol dehydrogenation reaction was completed in a micro-catalytic reactor. Prior to the reaction, the nanosphere catalyst was heated to about 350° C. for about 1 h in flowing helium, then cooled to the reaction temperature. The reaction conditions were conducted at about 330° C., 20 mL per minute of He carrier gas flow over a 100 mg bed of catalyst having a Cu loading of 3 weight percent. Five to ten pL pulses of ethanol were vaporized into the He carrier gas stream to create the reactant feed. Pulses of unreacted ethanol and the products of reaction were partitioned on a GC column and detected by a thermal conductivity detector.

The silica nanospheres have been characterized by Fourier Transform Infrared (FTIR) spectroscopy. The nanospheres were scanned just after their introduction into the sample chamber at 25° C. and 1 atm. Subsequently, the samples were evacuated to <1 milli-Torr at 25° C. and their spectrum was recorded. The nanospheres were then heated to 100, 200, and 300° C. in vacuo and their spectra were recorded under these conditions.

Under 1 atm pressure at room temperature, the sample shows a large, broad peak between 3000 and 4000 cm$^{-1}$ that is characteristic of adsorbed, molecular water. This feature decreases to a negligible level immediately upon evacuation at room temperature. This result suggests that most of the water is only weakly adsorbed to the silica nanospheres. Additional peaks are present at 1800, 1600, 1200 and 800 cm$^{-1}$. In vacuo at 25 C, a sharp peak appears at 3700 cm$^{-1}$ and a broad peak near 3400 cm$^{-1}$. When the sample is heated to 300 C under vacuum, the peak at 3700 cm$^{-1}$ grows even sharper and the adjacent peak at 3400 cm$^{-1}$ grows smaller, demonstrating further water removal. With increased heating above 200 C, the peaks at 1200 and 800 cm$^{-1}$ at first increase and then broaden and decrease in intensity as a shift of intensity to higher frequency features is apparent.

Flame-hydrolyzed, amorphous silica shows a signature for the SiO—H vibration near 3743 cm$^{-1}$ and a broad peak near 3400 cm$^{-1}$ that corresponds to adsorbed water. Additionally, Si—O vibrations are evident at 1800 and 1600 cm$^{-1}$. It appears that the surface functional groups found on the silica nanospheres are similar to those found to be present on Cab-O-Sil™.

The effect of the Cu/silica nanocatalyst on the ethanol dehydrogenation reaction is presented in Table 1. Acetaldehyde was the only product observed. Forty five percent of the ethanol was converted over about 3 mg of Cu in the 100 mg sample of Cu/silica using the nano-silica sample. The conversion per mg of Cu in this sample is 45%/3 mg or 15% conversion/mg Cu. Compare this to the results reported by Kenvin et al. for a Cu/silica prepared from Cab-O-Sil™ and operated under similar conditions (300 C, 5.1. mg Cu ion +143 mg of silica, 15.5 mL/minute of He carrier, 1–2 L of ethanol in liquid pulses). These authors observed 25% conversion over 5.1 mg Cu for a 5.1% conversion/mg Cu. No other products were observed.

These results demonstrate that the conversion efficiency for the catalyst formed from the copper loaded silica nanospheres is at least comparable to if not better than that formed from the fumed silica (within the accuracy of the micro-catalytic technique for determining catalyst activity). Moreover, the selectivity to form acetaldehyde is the same for the two catalysts. Each solid catalyzes the single reaction to form the simple dehydrogenation product without the side reaction corresponding to ethyl acetate coupling. The absence of the ethyl acetate forming reaction shows that no large ensembles of Cu are present in either sample.

TABLE 1

SUMMARY OF RESULTS

| Species | Nanosphere mol % | Fused Silica mol % |
|---|---|---|
| EtOH | 55 | 75 |
| Acetaldehyde | 45 | 25 |
| Other products | 0 | 0 |

The results obtained using the nanospheres clearly demonstrate that only the products of mono-atomically dispersed Cu (only acetaldehyde is observed) with an apparently improved efficiency. It should be noted that the process for forming the new catalyst suggests an additional advantage in that it might replace the present technique for making fumed amorphous silica by a process that is environmentally benign. The currently applied process for making fumed silica burns silicon tetrachloride to make silica and HCl. The present embodiment, which relies on an elevated temperature synthesis involving only an Si/SiO$_2$ mixture, eliminates the need to handle silicon tetrachloride and it does not produce the hydrochloric acid gas.

C. SiO$_2$/SnO$_x$ Nanostructures

Another exemplary embodiment of the present invention provides for silicon dioxide/tin oxide (SiO$_2$/SnO$_x$) nanostructures and methods of preparation thereof. In general, the SiO$_2$/SnO$_x$ nanostructures include SiO$_2$ nanostructures having SnO$_x$ nanoclusters (x is between about 1 and 2) deposited onto the surface of the SiO$_2$ nanostructures. The SiO$_2$ nanostructures can range in diameter from about 8 nanometers (nm) to 45 nm, while the SnO$_x$ nanoclusters can vary in size and shape, but are generally between about 3 nm to 10 nm across.

The method of fabricating SiO$_2$/SnO$_x$ nanostructures is a single-step in situ synthesis. In general, SiO$_2$/SnO$_x$ nanostructures can be fabricated from a mixture of Si/SiO$_2$ and a small amount of SnO by heating the mixture of Si/SiO$_2$ and SnO to approximately 1300° C. in a reactor (as described below) and maintaining the temperature for approximately 3 to 14 hours, about 10 to 14 hours, and preferably for about 12 hours. Modifications in fabrication parameters (e.g., reactant mixture stoichiometry, flow conditions (kinetics), and temperature range) can be used to control the quality and quantity of the fabricated SiO$_2$/SnO$_x$ nanostructures.

In general, SiO$_2$ nanostructures (e.g., nanospheres) can range in diameter between about 8 to 45 nm and about 30 to 45 nm. SnO$_x$ nanoclusters (x=1 and/or 2) having various shapes (e.g., planar, semi-planar, spherical, semi-spherical, polygonal, semi-polygonal, or combinations thereof) are located on the surface of the SiO$_2$ nanostructures. The size of the SnO$_x$ nanocluster, as measured across (e.g., diameter, width, length, etc.) the SnO$_x$ nanostructure, can vary depending on the shape of the SnO$_x$ nanocluster. However, in general, the SnO$_x$ nanoclusters can range between about 3 to 10 nm and about 3 to 6 nm across. The SiO$_2$/SnO$_x$ nanostructures can have a Si:Sn molar ratio between about 100:1, 25:1, or 20:1. Modifications in fabrication parameters (e.g., reactant mixture stoichiometry, flow conditions (kinetics), and temperature range) can be used to control the size of the SiO$_2$ nanostructures, the size of the SnO$_x$ nanoclusters, and the Si:Sn ratio.

As described below, the SiO$_2$/SnO$_x$ nanostructures are more active than larger SnO$_2$ structures and comparable to the activity of SnO. The SiO$_2$/SnO$_x$ nanostructures may be used as chemical sensors and to promote enhanced reactivity or catalytic activity. Other aspects of the chemical sensor are known in the art and will not be discussed here.

EXAMPLE 3

The following is a non-limiting illustrative example of an embodiment of the present invention that is described in more detail in Gole J. L., Wang, Z. L., Nanoletters, Vol. 1, Num. 8, 449–451, (2001), which is incorporated herein by reference. This example is not intended to limit the scope of any embodiment of the present invention, but rather is intended to provide specific experimental conditions and results. Therefore, one skilled in the art would understand that many experimental conditions can be modified, and it is intended that these modifications are within the scope of the embodiments of the present invention.

The apparatus used to fabricate the $SiO_2/SnO_x$ nanostructures includes a double concentric alumina tube combination that can be heated to the desired temperature in a Lindberg Scientific™ tube furnace configuration. The inner alumina tube is vacuum sealed by two water cooled stainless steel end pieces, which are attached to the alumina tube and tightly lock-press fit against custom viton o-rings. At one end of the furnace, ultra-high purity argon (Ar) enters through the upstream stainless steel end piece and passes through a matched set of zirconia insulators to the central region of the inner tube oven. Here the entraining argon flows over a crucible containing the sample mixture of interest at a flow rate of about 100 standard cubic centimeters per minute (sccm) controlled by a flow controller.

The total tube pressure in the inner tube can range from 200 to 650 Torr as measured by a Baratron™ differential pressure transducer, but is typically about 300 Torr. The pressure in the inner tube can be controlled by a mechanical pump or other appropriate throttle valve attachments connected to the inner alumina tube through the downstream stainless steel end piece. This end piece is mechanically attached to a "water cooled" cold plate, with an adjustable temperature system, through a matching set of insulating zirconia blocks. Depending on the desired temperature range of operation, the crucibles used to contain the $Si/SiO_2$ and SnO mixture were either commercially available quartz (1200–1350° C.) or alumina (1400–1500° C.). The parameters that could be controlled in this experiment were (1) gas flow rate, (2) total tube gas pressure, (3) central region temperature and temperature gradients to the end regions, and (4) cold plate temperature. The ultra-high purity argon was not heated before it entered the inner furnace tube, although it could be heated.

In particular, $SiO_2/SnO_x$ nanostructures depicted in FIG. 1 have been synthesized by passing ultra high purity argon entrainment gas over a crucible located in the central region of the inner tube of the sealed double concentric alumina tube-oven configuration described above. The parameters controlled in this experiment were (1) argon flow rate, (2) total tube gas pressure, (3) central region temperature, and (4) temperature gradients to the end regions. The alumina crucible used to contain the reactant mixture used in these experiments was heated to 1300° C. and maintained at that temperature for 12 hours. The alumina crucible contained a $Si/SiO_2$ mixture (about a 1:1 mixture of $Si/SiO_2$) into which was interspersed a small percentage of SnO (between about 1% and 5%, and preferably about 2%) and a manganese catalyst (between about 0.5% and 5%, and preferably about 1%). The argon flow rate was about 100 sccm, while the total tube pressure for the sealed inner tube was about 300 Torr and was controlled by a Welch™ 1402 mechanical pump. Gram quantities of $SiO_2/SnO_x$ nanostructures ($SiO_2$ nanospheres impregnated by $SnO_x$ cluster islands) deposited on both the wall of the inner alumina tube, which is about 900–1000° C., and on a cold plate positioned at the downstream onset of the interface region.

The transmission electron micrographs depicted in FIG. 1 were obtained at 200 kV using a Hitachi™ HT-2000 TEM. The chemical composition of the $SiO_2/SnO_x$ nanostructures was determined (FIG. 2) by energy dispersive x-ray spectroscopy (EDS).

Figure 1B:
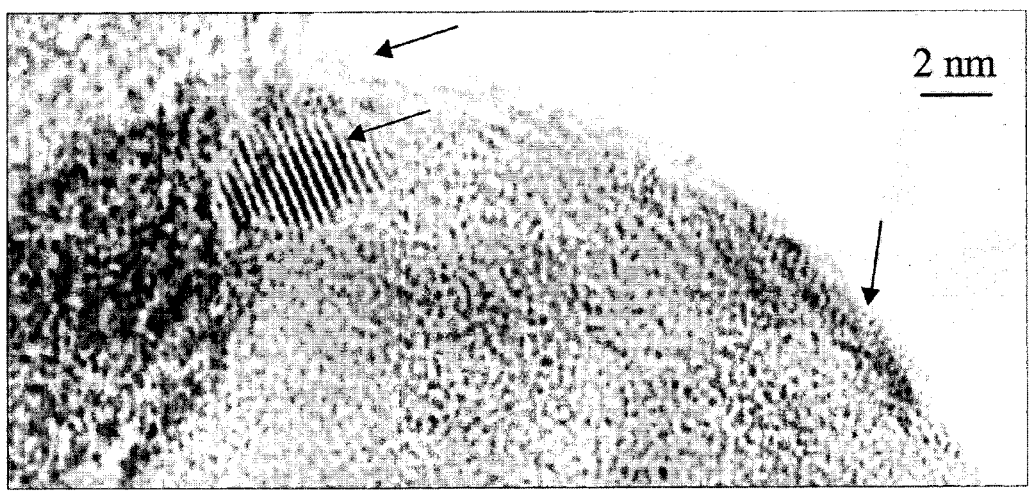
Figure 2:
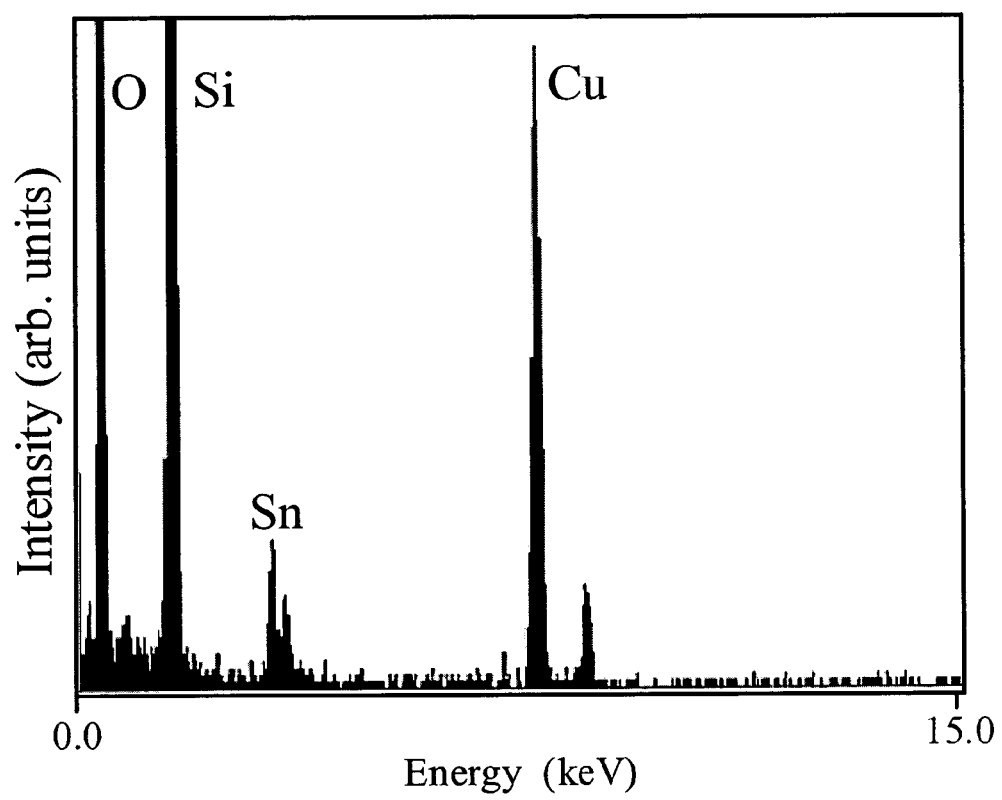
FIG. 2 is an energy-dispersive X-ray spectrum illustrating the presence of tin (Sn), oxygen (O), and silicon (Si) in the $SiO_2/SnO_x$ nanostructure shown in the TEM image shown in FIG. 1B.

FIG. 1A illustrates a transmission electron micrograph (TEM) of partially agglomerated monodisperse $SiO_2$ nanospheres of about 45 nm in diameter on which are interspersed small $SnO_x$ islands. The assessment of the $SiO_2$ nanospheres and the attribution of the small dispersed islands of $SnO_x$ is aided by the EDS spectrum, illustrated in FIG. 2, which clearly indicates the presence of silicon and oxygen associated with the larger $SiO_2$ nanospheres and tin and oxygen (at considerably lower concentration) associated with the $SnO_x$ islands. The $SnO_x$ nanoclusters are distributed approximately uniformly over the surface of the $SiO_2$ nanospheres. The sizes of the $SnO_x$ structures ranges between about 3 and 6 nm. A quantitative EDS microanalysis shows that the Si:Sn ratio is approximately 25:1 across the $SiO_2$ nanosphere supports. No evidence is found for $SnO_x$ dispersed within the $SiO_2$. The high-resolution transmission electron microscopy (HRTEM) images of the $SnO_x$ nanoclusters given in FIG. 1B and the Moire patterns clearly demonstrate that they are crystalline. The $SnO_x$ nanoclusters appear to be among the smallest distinct $SnO_x$ nanoclusters generated to date. The $SnO_x$ nanoclusters cover the surface of the $SiO_2$ nanospheres as indicated by the arrows at the right-hand side of FIG. 1B. The precise crystal structure of the $SnO_x$ nanoclusters is not certain, however, the crystal structure is not inconsistent with the rutile structure of $SnO_2$.

The catalytic activity of $SiO_2/SnO_x$ nanostructures has been studied using a phenol probe. The hydroxylation of phenol provides a good measure of the intrinsic activity of a particular compound by measuring the rate of disappearance of phenol. The catalytic activity of the $SiO_2/SnO_x$ nanostructures was compared to a series of $SnO_x$ based catalysts including reagent grade $SnO_2$, SnO, and naked silica nanospheres.

In general, each catalyst was dried at 100° C. for at least 30 minutes before the phenol oxidation reactions were attempted. For each catalyst, a standard solution of 1.79 mL of 11.7 mM phenol solution (0.021 millimols) was combined with 9.6 mL, 3% by weight, $H_2O_2$ (8.5 millimols). These initial mixtures were analyzed in a Buck Scientific™ BLC-20 Isocratic Liquid Chromatograph (HPLC) equipped with a C18 column. After recording the color and the texture of the samples, 0.74 millimols of each catalyst was added to each solution. The reactions were monitored on the HPLC for at lease a three-day-period and data was recorded on the HPLC for each sample at least twice per day. For the $SiO_2/SnO_x$ nanostructures, first order rate constants were obtained that differed by at least a factor of between five and twelve times those for reagent grade SnO and $SnO_2$, respectively, as treated nanospheres and SnO were found to be catalytic. This comparison is for total material mass. No catalytic activity was noted for a blank run using the reactants catalogued above. The blank run showed very little conversion for runs up to 70 hours. Thus, $SiO_2/SnO_x$ nanostructures are more reactive than SnO and $SnO_2$.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A nanostructure, consisting essentially of a silicon dioxide ($SiO_2$)/tin oxide ($SnO_x$) nanostructure, wherein a $SiO_2$ nanostructure has $SnO_x$ nanoclusters dispersed over a portion of the surface of the $SiO_2$ nanostructure, and wherein x is selected from the group consisting of: 1 and 2.

2. The nanostructure of claim 1, wherein the $SiO_2/SnO_x$ nanostructure has a Si:Sn molar ratio between 100:1 and 20:1.

3. The nanostructure of claim 1, wherein the $SiO_2/SnO_x$ nanostructure has a Si:Sn molar ratio of about 25:1.

4. The nanostructure of claim 1, wherein the $SnO_x$ nanoclusters are between about 3 and 10 nanometers across.

5. The nanostructure of claim 1, wherein the $SnO_x$ nanoclusters are between about 3 and 6 nanometers across.

6. The nanostructure of claim 1, wherein the $SnO_x$ nanoclusters have a rutile crystal structure.

7. The nanostructure of claim 1, wherein the $SiO_2$ nanostructure is a nanosphere having a diameter in the range of about 8 to 45 nanometers, and wherein the $SiO_2/SnO_x$ nanostructure has a Si:Sn molar ratio between about 100:1 and 20:1.

8. The nanostructure of claim 1, wherein the $SiO_2$ nanostructure is a nanosphere having a diameter in the range of about 8 to 45 nanometers.

9. The nanostructure of claim 1, wherein the $SiO_2$ nanostructure is a nanosphere having a diameter in the range of about 30 to 45 nanometers.

10. A nanostructure, comprising a silicon dioxide ($SiO_2$)/tin oxide ($SnO_x$) nanostructure, wherein a $SiO_2$ nanostructure has $SnO_x$ nanoclusters dispersed over a portion of the surface of the $SiO_2$ nanostructure, wherein the $SiO_2$ nanostructure is a nanosphere having a diameter in the range of about 5 to 50 nanometers, wherein the $SnO_x$ nanoclusters are between about 3 and 10 nanometers across, wherein the $SiO_2/SnO_x$ nanostructure has a Si:Sn molar ratio between about 100:1 and 20:1, and wherein x is selected from the group consisting of: 1 and 2.

11. The nanostructure of claim 10, wherein the $SnO_x$ nanoclusters are between about 3 and 6 nanometers across.

12. The nanostructure of claim 10, wherein the $SnO_x$ nanoclusters have a rutile crystal structure.

13. The nanostructure of claim 10, wherein the $SiO_2$ nanostructure is a nanosphere having a diameter in the range of about 8 to 45 nanometers.

14. The nanostructure of claim 10, wherein the $SiO_2$ nanostructure is a nanosphere having a diameter in the range of about 30 to 45 nanometers.

15. The nanostructure of claim 10, wherein the $SiO_2/SnO_x$ nanostructure has a Si:Sn molar ratio of about 25:1.

16. A chemical sensor for detecting gases, consisting essentially of a silicon dioxide ($SiO_2$)/tin oxide ($SnO_x$) nanostructure, wherein a $SiO_2$ nanostructure has $SnO_x$ nanoclusters dispersed over a portion of the surface of the $SiO_2$ nanostructure, and wherein x is selected from the group consisting of: 1 and 2.

17. The chemical sensor of claim 16, wherein the $SiO_2/SnO_x$ nanostructure has a Si:Sn molar ratio between 100:1 and 20:1.

18. The chemical sensor of claim 16, wherein the $SiO_2/SnO_x$ nanostructure has a Si:Sn molar ratio of about 25:1.

19. The chemical sensor of claim 16, wherein the $SnO_x$ nanoclusters are between about 3 and 10 nanometers across.

20. The chemical sensor of claim 16, wherein the $SnO_x$ nanoclusters are between about 3 and 6 nanometers across.

21. The chemical sensor of claim 16, wherein the $SnO_x$ nanoclusters have a rutile crystal structure.

22. The chemical sensor of claim 16, wherein the $SiO_2$ nanostructure is a nanosphere having a diameter in the range of about 8 to 45 nanometers, and wherein the $SiO_2/SnO_x$ nanostructure has a Si:Sn molar ratio between about 100:1 and 20:1.

23. The chemical sensor of claim 16, wherein the $SiO_2$ nanostructure is a nanosphere having a diameter in the range of about 8 to 45 nanometers.

24. The chemical sensor of claim 16, wherein the $SiO_2$ nanostructure is a nanosphere having a diameter in the range of about 30 to 45 nanometers.

25. A nanostructure, comprising a silicon dioxide ($SiO_2$)/tin oxide ($SnO_x$) nanostructure, wherein a $SiO_2$ nanostructure has $SnO_x$ nanoclusters dispersed over a portion of the surface of the $SiO_2$ nanostructure, wherein x is selected from the group consisting of: 1 and 2, and wherein the $SnO_x$ nanoclusters are between about 3 and 10 nanometers across.

26. The nanostructure of claim 25, wherein the $SiO_2/SnO_x$ nanostructure has a Si:Sn molar ratio between 100:1 and 20:1.

27. The nanostructure of claim 25, wherein the $SiO_2/SnO_x$ nanostructure has a Si:Sn molar ratio of about 25:1.

28. The nanostructure of claim 25, wherein the $SiO_2$ nanostructure is a nanosphere having a diameter in the range of about 8 to 45 nanometers, and wherein the $SiO_2/SnO_x$ nanostructure has a Si:Sn molar ratio between about 100:1 and 20:1.

29. The nanostructure of claim 25, wherein the $SiO_2$ nanostructure is a nanosphere having a diameter in the range of about 8 to 45 nanometers.

30. The nanostructure of claim 25, wherein the $SiO_2$ nanostructure is a nanosphere having a diameter in the range of about 30 to 45 nanometers.

31. The nanostructure of claim 25, wherein the $SnO_x$ nanoclusters are between about 3 and 6 nanometers across.

32. A nanostructure, consisting of a silicon dioxide ($SiO_2$)/tin oxide ($SnO_x$) nanostructure, wherein a $SiO_2$ nanostructure has $SnO_x$ nanoclusters dispersed over a portion of the surface of the $SiO_2$ nanostructure, wherein x is selected from the group consisting of: 1 and 2, and wherein the $SnO_x$ nanoclusters are between about 3 and 10 nanometers across.

33. The nanostructure of claim 32, wherein the $SiO_2/SnO_x$ nanostructure has a Si:Sn molar ratio between 100:1 and 20:1.

34. The nanostructure of claim 32, wherein the $SiO_2/SnO_x$ nanostructure has a Si:Sn molar ratio of about 25:1.

35. The nanostructure of claim 32, wherein the $SiO_2$ nanostructure is a nanosphere having a diameter in the range of about 8 to 45 nanometers, and wherein the $SiO_2/SnO_x$ nanostructure has a Si:Sn molar ratio between about 100:1 and 20:1.

36. The nanostructure of claim 32, wherein the $SiO_2$ nanostructure is a nanosphere having a diameter in the range of about 8 to 45 nanometers.

37. The nanostructure of claim 32, wherein the $SiO_2$ nanostructure is a nanosphere having a diameter in the range of about 30 to 45 nanometers.

38. The nanostructure of claim 32, wherein the $SnO_x$ nanoclusters are between about 3 and 6 nanometers across.

39. A chemical sensor for detecting gases, comprising a silicon dioxide ($SiO_2$)/tin oxide ($SnO_x$) nanostructure, wherein a $SiO_2$ nanostructure has $SnO_x$ nanoclusters dispersed over a portion of the surface of the $SiO_2$ nanostructure, wherein x is selected from the group consisting of: 1 and 2, and wherein the $SnO_x$ nanoclusters are between about 3 and 10 nanometers across.

40. The chemical sensor of claim 39, wherein the $SiO_2$/$SnO_x$ nanostructure has a Si:Sn molar ratio between 100:1 and 20:1.

41. The chemical sensor of claim 39, wherein the $SiO_2$/$SnO_x$ nanostructure has a Si:Sn molar ratio of about 25:1.

42. The chemical sensor of claim 39, wherein the $SnO_x$ nanoclusters are between about 3 and 6 nanometers across.

43. The chemical sensor of claim 39, wherein the SnO, nanoclusters have a rutile crystal structure.

44. The chemical sensor of claim 39, wherein the $SiO_2$ nanostructure is a nanosphere having a diameter in the range of about 8 to 45 nanometers, and wherein the $SiO_2$/$SnO_x$ nanostructure has a Si:Sn molar ratio between about 100:1 and 20:1.

45. The chemical sensor of claim 39, wherein the $SiO_2$ nanostructure is a nanosphere having a diameter in the range of about 8 to 45 nanometers.

46. The chemical sensor of claim 39, wherein the $SiO_2$ nanostructure is a nanosphere having a diameter in the range of about 30 to 45 nanometers.

* * * * *